(12) United States Patent
Wu et al.

(10) Patent No.: US 7,625,801 B2
(45) Date of Patent: Dec. 1, 2009

(54) SILICIDE FORMATION WITH A PRE-AMORPHOUS IMPLANT

(75) Inventors: Chii-Ming Wu, Taipei (TW); Cheng-Tung Lin, Jhudong Township (TW); Chih-Wei Chang, Hsin-Chu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 449 days.

(21) Appl. No.: 11/523,678

(22) Filed: Sep. 19, 2006

(65) Prior Publication Data

US 2008/0070370 A1  Mar. 20, 2008

(51) Int. Cl.
  *H01L 21/336* (2006.01)
(52) U.S. Cl. .............................. 438/300; 257/E21.619
(58) Field of Classification Search ............... 438/300, 438/528, 533; 257/E21.619
  See application file for complete search history.

(56) References Cited

U.S. PATENT DOCUMENTS

| 6,004,871 | A | 12/1999 | Kittl et al. |
| 6,376,372 | B1 | 4/2002 | Paranjpe et al. |
| 6,380,057 | B1 | 4/2002 | Buynoski et al. |
| 6,890,854 | B2 | 5/2005 | Lee et al. |
| 7,279,758 | B1 * | 10/2007 | Li et al. ..................... 257/408 |
| 7,413,957 | B2 * | 8/2008 | Nouri et al. ................. 438/300 |
| 2004/0087121 | A1 | 5/2004 | Kammler et al. |
| 2006/0073656 | A1 | 4/2006 | Jain et al. |

OTHER PUBLICATIONS

Erokhin, Y. N., et al., "Spatially confined nickel disilicide formation at 400 °C on ion implantation preamorphized silicon," Appl. Phys. Lett. 63 (23), Dec. 6, 1993, 1993 American Institute of Physics, pp. 3173-3175.

* cited by examiner

*Primary Examiner*—Chandra Chaudhari
(74) *Attorney, Agent, or Firm*—Slater & Matsil, L.L.P.

(57) ABSTRACT

A method for forming a semiconductor structure includes providing a semiconductor substrate, forming a gate stack on the semiconductor substrate, forming a silicon-containing compound stressor adjacent the gate stack, implanting non-siliciding ions into the silicon-containing compound stressor to amorphize an upper portion of the silicon-containing compound stressor, forming a metal layer on the silicon-containing compound stressor while the upper portion of the SiGe stressor is amorphous, and annealing to react the metal layer with the silicon-containing compound stressor to form a silicide region. The silicon-containing compound stressor includes SiGe or SiC.

11 Claims, 5 Drawing Sheets

SILICIDE FORMATION WITH A PRE-AMORPHOUS IMPLANT

TECHNICAL FIELD

This invention relates generally to semiconductor devices, and more particularly to manufacturing methods of metal-oxide-semiconductor (MOS) devices.

BACKGROUND

The deep-submicron scaling required for VLSI systems dominates design considerations in the microelectronics industry. As the gate electrode length is scaled down, the source and drain junctions must be scaled down accordingly to suppress the so-called short channel effects (SCE) that degrade the performance of miniaturized devices. A major problem related to complementary metal oxide silicon (CMOS) scaling is the undesirable increase in parasitic resistance. As the source/drain junction depth and polycrystalline silicon line width are scaled into the deep-submicron range, contact resistance becomes more significant and needs to be reduced.

The principle way of reducing the contact resistance between polysilicon gates and source/drain regions and interconnect lines is to form metal silicides atop the source/drain regions and the gate electrodes. Silicide regions are typically formed by a salicide (self-aligned silicide) process. In the salicide process, a thin layer of metal is blanket deposited over the semiconductor substrate, specifically over exposed source/drain and gate electrode regions. The wafer is then subjected to one or more annealing steps. This annealing process causes the metal to selectively react with the exposed silicon of the source/drain regions and the gate electrode, thereby forming a metal silicide. The process is referred to as a self-aligned silicidation process because the silicide layer is formed only where the metal material directly contacts the silicon source/drain regions and the polycrystalline silicon (polysilicon) gate electrode. Following the formation of the silicide layer, the un-reacted metal is removed.

The conventional silicide formation processes suffer drawbacks. For example, in the formation of NMOS devices, due to a high arsenic concentration in the source/drain regions, nickel silicide often encroaches under spacers. As a result, the distance between the silicide regions and the respective source/drain junctions is reduced. The distances are particularly smaller in lightly-doped source/drain regions due to their shallow junctions. Leakage currents are thus increased. In the formation of PMOS devices, on the other hand, the source/drain regions are often formed of SiGe. It has been found that the silicide regions formed on SiGe often have greater roughness due to non-uniform SiGe formation. Also, the thickness of the silicide regions varies significantly. For integrated circuits with shallow junctions, the thickness variation of the silicide regions causes a degradation in the performance of the MOS devices. Therefore, new silicide formation methods are needed.

SUMMARY OF THE INVENTION

In accordance with one aspect of the present invention, a method for forming a semiconductor structure includes providing a semiconductor substrate, forming a gate stack on the semiconductor substrate, forming a silicon-containing compound stressor adjacent the gate stack, wherein the silicon-containing compound stressor further comprises an additional element that forms a compound with silicon, implanting non-siliciding ions into the silicon-containing compound stressor to amorphize an upper portion of the silicon-containing compound stressor, forming a metal layer on the silicon-containing compound stressor while the upper portion of the silicon-containing compound stressor is amorphous, and annealing to react the metal layer with the silicon-containing compound stressor to form a silicide region. The silicon-containing compound stressor includes SiGe or SiC.

In accordance with another aspect of the present invention, a method for forming a semiconductor structure includes providing a semiconductor substrate, forming a gate stack on the semiconductor substrate, forming a source/drain region adjacent the gate stack, implanting light ions into the source/drain region to amorphize an upper portion of the source/drain region, forming a metal layer on the source/drain region while the upper portion of the source/drain region is amorphous, and annealing to react the metal layer with the source/drain region to form a silicide region.

In accordance with yet another aspect of the present invention, a method for forming a semiconductor structure includes providing a semiconductor substrate, forming a gate stack on the semiconductor substrate, and forming a silicon-containing compound stressor adjacent the gate stack, wherein the silicon-containing compound stressor comprises an element that forms a compound with silicon, and wherein an atomic percentage of the element to silicon and the element in the silicon-containing compound stressor is greater than about 20 percent. The method further includes implanting an additional element selected from the group consisting essentially of nitrogen and carbon into the silicon-containing compound stressor to amorphize an upper portion thereof, forming a metal layer on the silicon-containing compound stressor, and annealing to react the metal layer with the silicon-containing compound stressor to form a silicide region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for improving a silicidation process is provided. The intermediate stages of manufacturing a preferred embodiment of the present invention are illustrated in FIGS. 1 through 8. Variations of the preferred embodiments are then discussed. Throughout the various views and illustrative embodiments of the present invention, like reference numbers are used to designate like elements.

Figure 1:
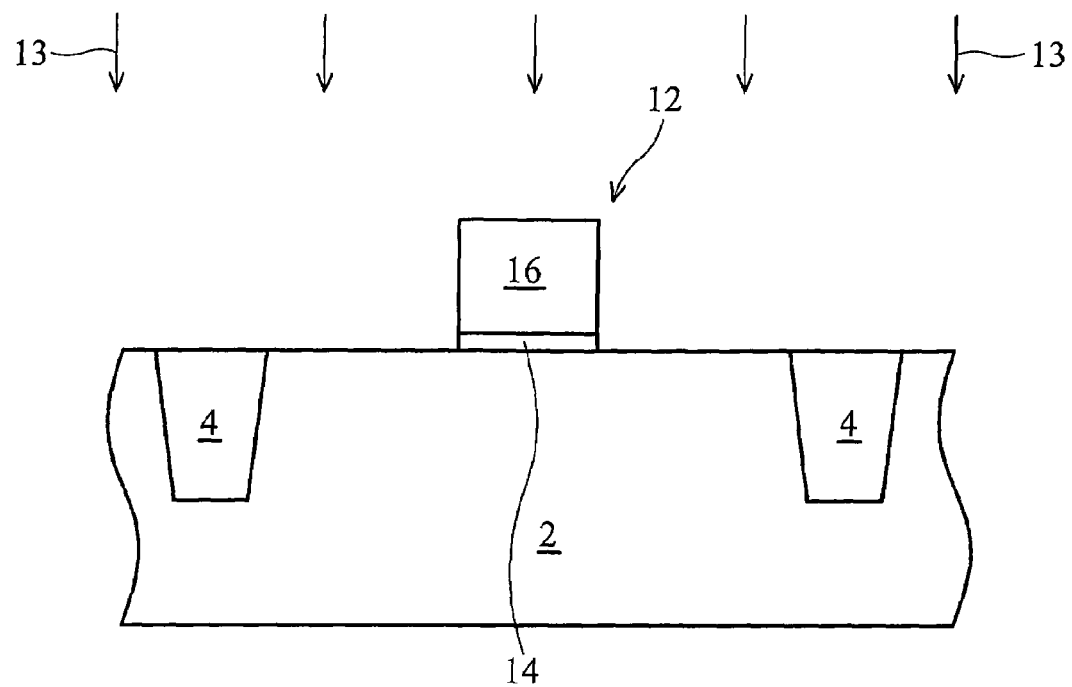
FIGS. 1 through 8 are cross-sectional views of intermediate stages in the manufacture of a PMOS embodiment.

Referring to FIG. 1, a substrate 2 is provided, which may be a bulk silicon substrate. Alternatively, substrate 2 comprises bulk SiGe or other semiconductor materials. Substrate 2 may also have a composite structure such as silicon on insulator (SOI). Shallow trench isolation (STI) regions 4 are formed in substrate 2 to isolate device regions. As is known in the art, STI regions 4 may be formed by etching substrate 2 to form recesses therein and then filling the recesses with a dielectric material.

A gate stack 12, including a gate dielectric 14 and a gate electrode 16, is formed on substrate 2. Gate dielectric 14 may include commonly used dielectric materials such as oxides, nitrides, oxynitrides, and combinations thereof. Gate electrode 16 may include doped polysilicon, metals, metal silicides, metal nitrides, and combinations thereof. As is known in the art, gate dielectric 14 and gate electrode 16 are preferably formed by depositing a gate electrode layer on a gate dielectric layer, and then patterning the gate electrode layer and the gate dielectric layer.

A pre-amorphized implantation (PAI), as symbolized by arrows 13, may be performed to reduce the dopant channeling effect and enhance dopant activation. In the preferred embodiment, silicon, germanium or carbon is implanted. In other embodiments, inert gases, such as neon, argon, krypton, xenon, and radon, are used. The PAI prevents subsequently doped impurities from channeling through spaces within the crystal lattice structure and reaching depths greater than desired. At least a top portion of the (polysilicon) gate electrode 16 and exposed portions of the (single crystalline) substrate 2 are turned into an amorphous state as a result of the PAI.

Figure 2:
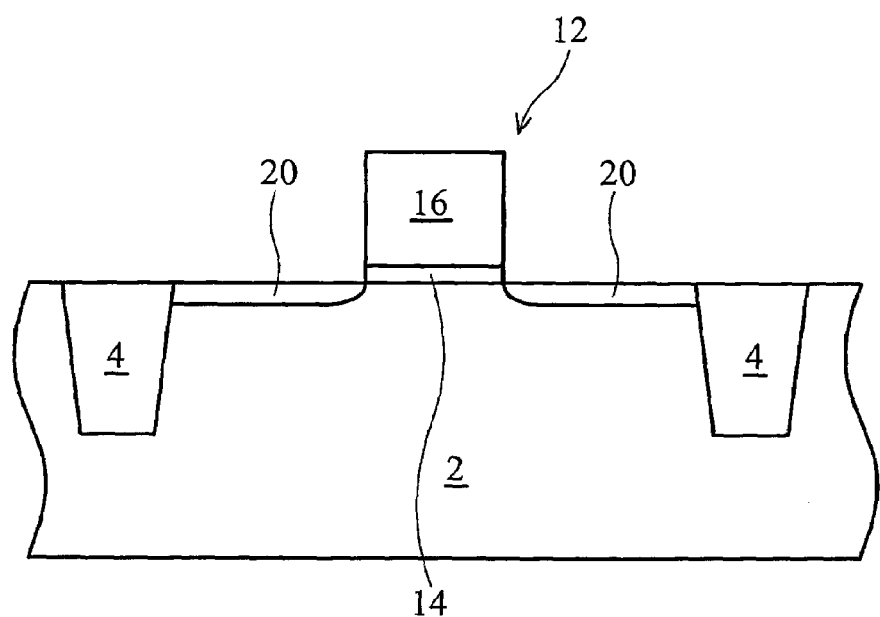

Lightly doped source/drain (LDD) regions 20 are then formed, preferably by implanting a p-type impurity, as is shown in FIG. 2. Gate stack 12 acts as a mask so that LDD regions 20 are substantially aligned with the edges of gate stack 12. Halo/pocket regions (not shown) are also formed, preferably by implanting n-type impurities.

Figure 3:
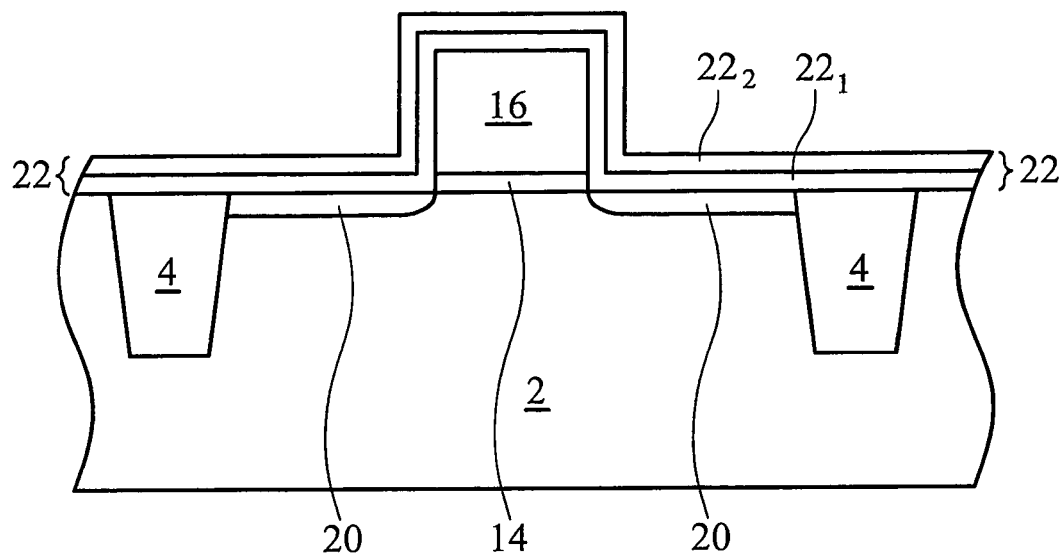

Referring to FIG. 3, a gate spacer layer 22 is formed. In the preferred embodiment, gate spacer layer 22 includes a liner oxide layer $22_1$ and an overlying nitride layer $22_2$. In alternative embodiments, gate spacer layer 22 includes one or more layers, each comprising oxide, silicon nitride, silicon oxynitride (SiON) and/or other dielectric materials, and may be formed using commonly used techniques, such as plasma enhanced chemical vapor deposition (PECVD), low-pressure chemical vapor deposition (LPCVD), sub-atmospheric chemical vapor deposition (SACVD), and the like.

Figure 4:
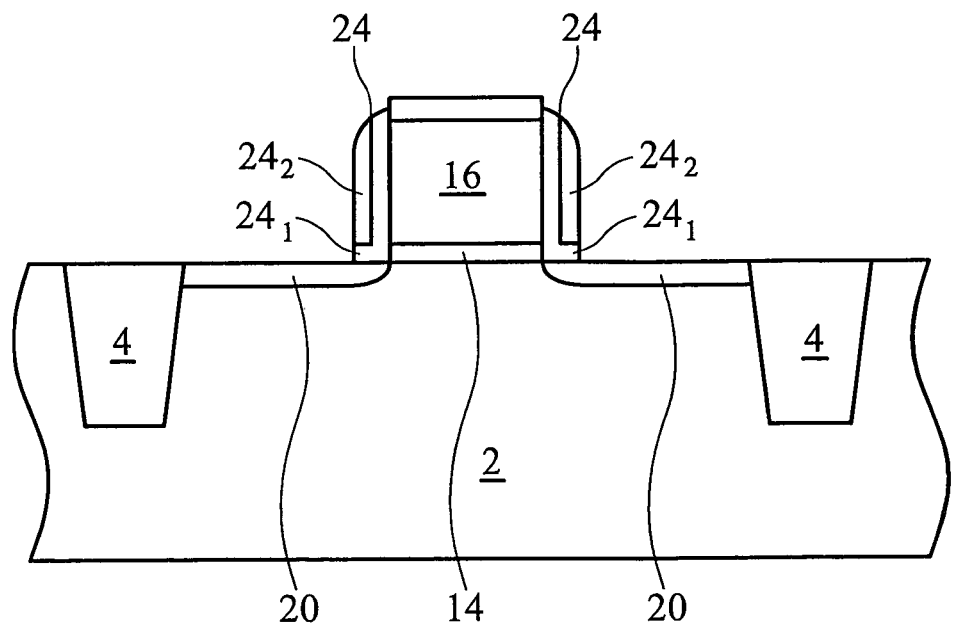

FIG. 4 illustrates the patterning of gate spacer layer 22 to form gate spacers 24, wherein the patterning may be performed by either wet etching or dry etching. Preferably, the spacer is formed by anisotropic etching. The remaining portions of liner oxide layer $22_1$ and nitride layer $22_2$ thus form liner oxide portions $24_1$ and nitride portions $24_2$, respectively.

Figure 5:
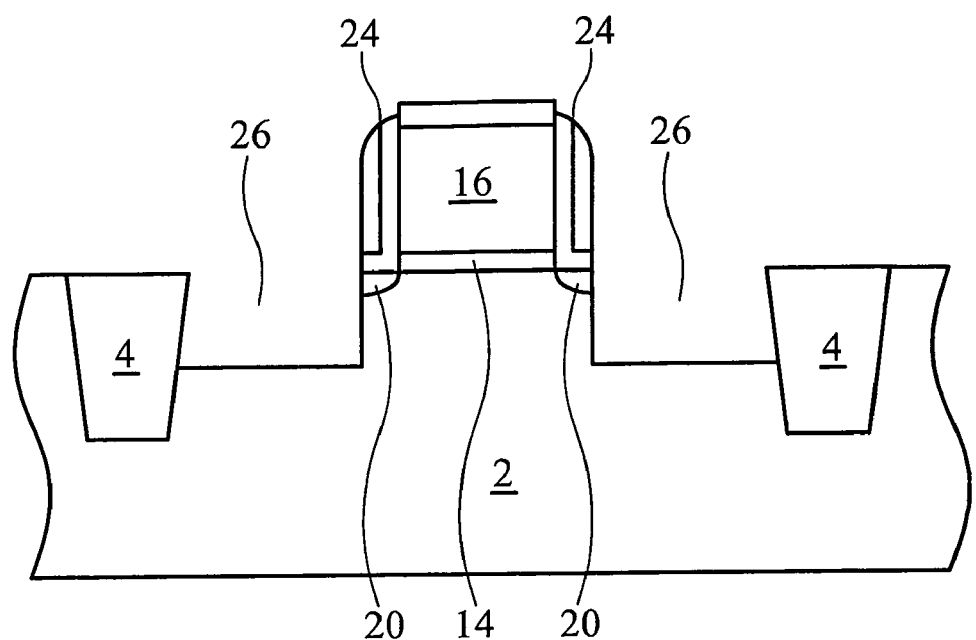

Referring to FIG. 5, recesses 26 are formed along the edges of gate spacers 24, preferably by etching isotropically or anisotropically. The depth of recesses 26 is preferably greater than the depth of the channel region of the resulting MOS device. In 90 nm technology, the depth of the recesses 26 may be between about 500 Å and about 1500 Å, and more preferably between about 700 Å and about 900 Å.

Figure 6:
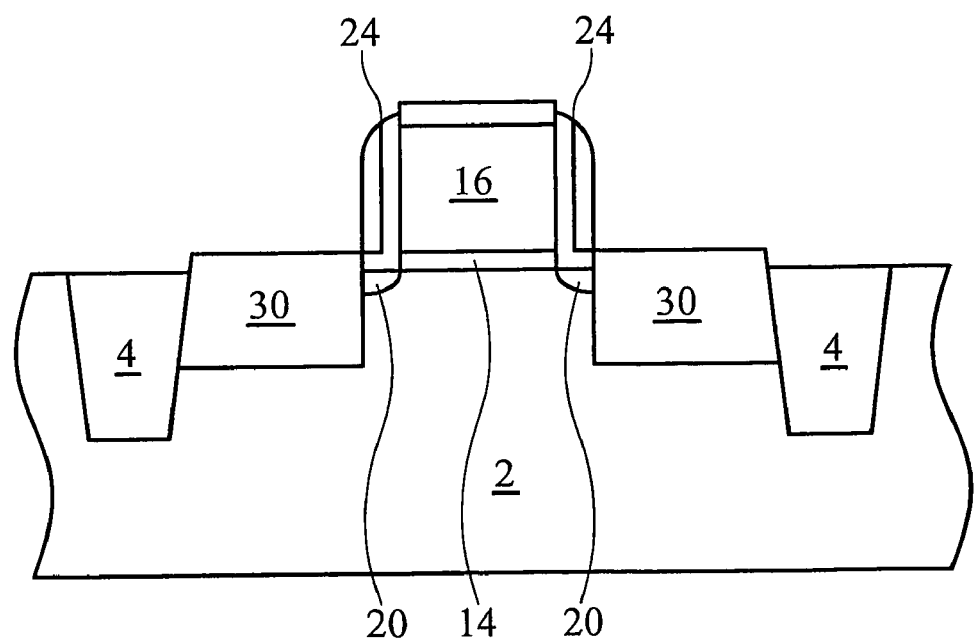

FIG. 6 illustrates the formation of epitaxy regions 30, which are often referred to as SiGe stressors 30. The preferred formation methods include selective epitaxial growth (SEG) of SiGe in recesses 26. SiGe stressors 30 preferably have a greater lattice constant than the lattice constant of silicon substrate 2. In an exemplary embodiment, the SiGe epitaxy is performed using PECVD in a chamber in which precursors are introduced. The preferred precursors include Si-containing gases and Ge-containing gases, such as $SiH_4$ and $GeH_4$, respectively. As is known in the art, the atomic percentage of germanium to silicon and germanium affects the stress applied to a channel region of the resulting PMOS device, and a high germanium atomic percentage results in a high stress. Preferably, the germanium atomic percentage is preferably greater than about 20 percent, and more preferably greater than about 23 percent. The increase in the germanium atomic percentage may be achieved by increasing a partial pressure of $GeH_4$. However, with a greater germanium atomic percentage, more severe germanium aggregation occurs. As a result, the thickness of the subsequently formed silicide/germanosilicide region has a greater variation in thickness.

Figure 7:
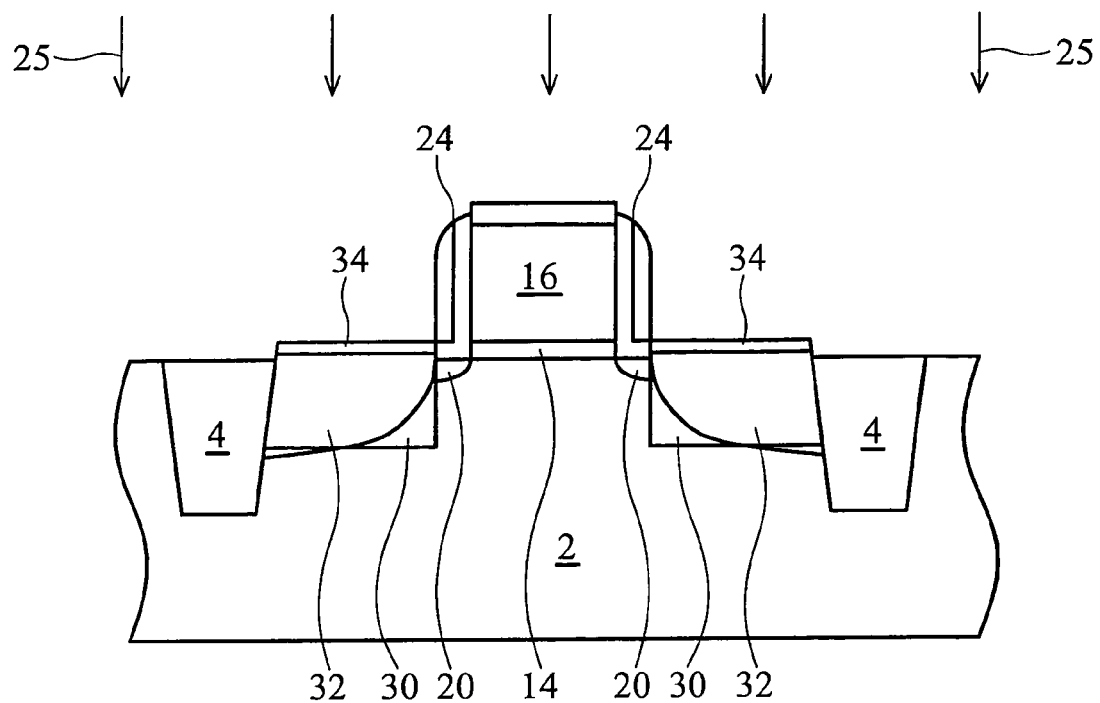

Referring to FIG. 7, source/drain regions 32 are formed, preferably by implanting a p-type impurity, such as boron, indium, and the like, into substrate 2. In an exemplary embodiment, the p-type impurity is implanted to a dosage of greater than about 1E15 atoms/cm$^2$.

Another pre-amorphized implantation (PAI), as symbolized by arrows 25, is performed. In SiGe stressors 30, the formation of SiGe tends to be non-uniform, and germanium tends to aggregate in some of the regions. This results in certain SiGe regions having a higher germanium concentration than in other regions. In the subsequent silicide/germanosilicide formation process, since it is more difficult for germanium to react with metal than with silicon, in the area wherein the germanium concentration is higher, less germano-silicide is formed, and the thickness of the germanium-silicide is smaller. The PAI process serves the function of scattering germanium, resulting in a more uniform germanium concentration in surface portions of SiGe stressors 30. After the PAI process, at least a top portion of SiGe stressors 30 are turned into an amorphous state, and the amorphous regions are schematically shown as regions 34. The thickness of amorphous regions 34 is preferably comparable to the thickness of the SiGe regions to be consumed in the subsequent salicide process, for example, between about 100 Å and about 300 Å. The implant energy of the PAI process is preferably between about 5 keV and about 25 keV. In one embodiment, the PAI process uses one energy. In other embodiments, the PAI process includes more than one implants with different energies, for example, a low-energy PAI process and by a high-energy PAI process. In an exemplary embodiment, the energy of the low-energy PAI process is between about 2 keV and about 10 keV, while the energy of high-energy PAI process is between about 10 keV and about 25 keV.

The implanted elements (ions) may include inert gases, such as neon, argon, krypton, xenon, and radon. In other embodiments, nitrogen and/or carbon may be used. Nitrogen and carbon are preferred for its additional ability to retard diffusion of impurities in source/drain regions (including lightly doped source/drain regions). In yet other embodiments, light ions that have an atomic number lower than that of silicon, such as boron, $F_2$, BF2, and the like may be used. When light ions are used, the dosage of the PAI process may be increased to achieve the desired germanium scattering effect. However, the implanting energy is preferably kept relatively low to prevent the small sized ions from channeling too deep into SiGe stressors 30. The relatively small scattering effect by each light ion is compensated for by the relatively high dosage. For example, the implant energy for implanting nitrogen and/or carbon is preferably between about 5 keV and about 15 keV, while the dosage is preferably between about 1E14 atoms/cm$^2$ and about 1E16 atoms/cm$^2$. In yet other embodiments, heavy ions, which are heavier than germanium, such as In, Sb, Xe, and the like may be used. Preferably, for heavier ions, the preferred dosage is lower, while for lighter ions, the preferred dosage is higher.

Preferably, the elements (ions) used in the PAI process are non-siliciding elements, which include non-metal elements and metal elements that do not form silicide. Throughout the description, non-siliciding elements are elements that do not form silicide with silicon at low temperatures, for example, 400° C. and below. As is known in the art, when implanted into SiGe stressors 30, the implanted ions will have a certain distribution, with a small portion of the implanted ions penetrating deeper than the majority of the implanted ions. The ions deeper in the SiGe stressors 30 may form silicide/germano-silicide with the surrounding silicon/SiGe. As a result, silicide spikes are formed, and the leakage current is thus increased. However, metals that do not form silicide with silicon/SiGe, such as antimony, may be implanted.

Figure 8:
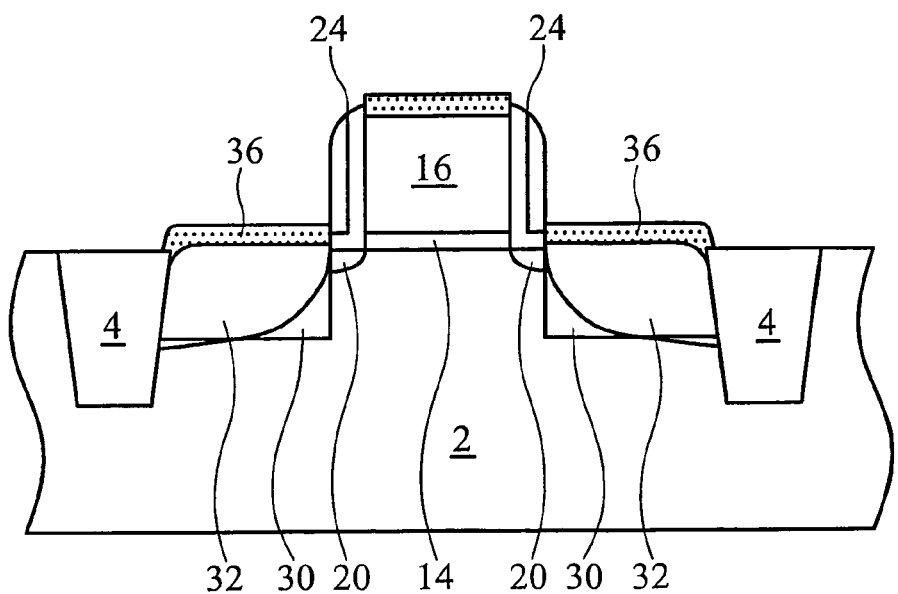

FIG. 8 illustrates the formation of germano-silicide regions 36, which are also referred to as silicide regions 36 throughout the description. As is known in the art, germano-silicide regions 36 may be formed by blanket depositing a metal layer (not shown), which may include nickel, platinum, palladium, vanadium, titanium, cobalt, tantalum, titanium, ytterbium, zirconium, and combinations thereof. The substrate is then heated, which causes silicon and germanium to react with the metal layer where they are in contact. After the reaction, a layer of metal silicide and/or metal germano-silicide is formed between silicon/germanium and metal. The un-reacted metal layer is then removed.

Figure 9:
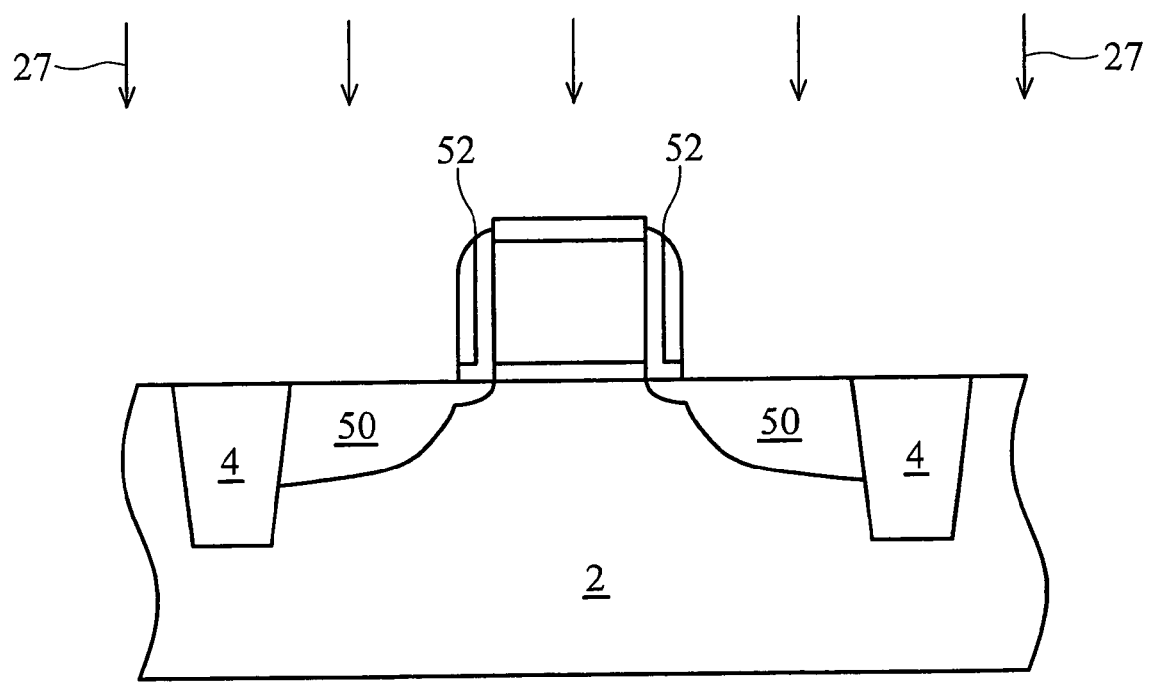
FIG. 9 illustrates a cross-sectional view of an intermediate step in the formation of an NMOS embodiment.

FIG. 9 illustrates a cross-sectional view of an intermediate stage in the formation of an NMOS device. Source/drain regions 50 of the NMOS device are preferably implanted with n-type impurities, such as arsenic, phosphorous, and the like. NMOS devices do not have a high germanium concentration in the source/drain regions, and thus do not suffer from a germanium aggregation problem. However, due to a high concentration of the commonly used arsenic in source/drain regions 50, the subsequently formed source/drain silicides will extend under gate spacers 52. One way to solve this problem is by performing a PAI process (symbolized by arrows 27) on source/drain regions 50 before the silicidation process. As is known in the art, SiC stressors may be formed for NMOS devices. The process for forming SiC stressors is preferably similar to the formation process of SiGe stressors, which includes forming recesses in substrate adjacent a gate stack, and epitaxially growing SiC stressors. N-type impurities may be doped when the epitaxial growth proceeds, or after the formation of SiC stressors.

The PAI process for the NMOS device may be performed simultaneously with the PAI process for the PMOS device. Although source/drain regions of both the NMOS and PMOS devices may be pre-amorphized prior to the silicidation process, different purposes are served. In NMOS devices, particularly NMOS devices with high arsenic concentrations, the PAI process is performed to reduce silicide encroachment under the spacers. As a comparison, PMOS devices suffer less from encroachment problems. Instead, the PAI process will reduce the germanium aggregation and improve the profile of the silicide region in PMOS devices.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure comprising:
    providing a semiconductor substrate;
    forming a gate stack on the semiconductor substrate;
    forming a silicon-containing compound stressor adjacent the gate stack, wherein the silicon-containing compound stressor further comprises an additional element that forms a compound with silicon;
    implanting non-siliciding ions into the silicon-containing compound stressor to amorphize an upper portion of the silicon-containing compound stressor;
    forming a metal layer on the silicon-containing compound stressor while the upper portion of the silicon-containing compound stressor is amorphous; and
    annealing to react the metal layer with the silicon-containing compound stressor to form a silicide region.

2. The method of claim 1, wherein an atomic percentage of the additional element in the silicon-containing compound stressor is greater than about 20 percent.

3. The method of claim 1, wherein the non-siliciding ions are selected from the group consisting essentially of neon, argon, krypton, xenon, radon, antimony, indium, arsenic, nitrogen, carbon, and combinations thereof.

4. The method of claim 1, wherein the non-siliciding ions comprise ions selected from the group consisting essentially of nitrogen ions and carbon ions.

5. The method of claim 1, wherein the metal layer comprises a material selected from the group consisting essentially of nickel, platinum, palladium, vanadium, titanium, cobalt, tantalum, ytterbium, zirconium, and combinations thereof.

6. The method of claim 1, wherein the step of implanting the non-siliciding ions uses an energy of between about 5 keV and about 25 keV.

7. The method of claim 1 further comprising doping the silicon-containing compound stressor with a p-type impurity, wherein a dosage of the impurity is greater than about 1E15/cm$^2$.

8. The method of claim 1, wherein the additional element in the silicon-containing compound stressor is selected from the group consisting essentially of germanium and carbon.

9. A method for forming a semiconductor structure comprising:
    providing a semiconductor substrate;
    forming a gate stack on the semiconductor substrate;
    forming a silicon-containing compound stressor adjacent the gate stack, wherein the silicon-containing compound stressor comprises an element that forms a compound with silicon, and wherein an atomic percentage of the element to silicon and the element in the silicon-containing compound stressor is greater than about 20 percent;
    implanting an additional element selected from the group consisting essentially of nitrogen and carbon into the silicon-containing compound stressor to amorphize an upper portion thereof;
    forming a metal layer on the silicon-containing compound stressor; and
    annealing to react the metal layer with the silicon-containing compound stressor to form a silicide region.

10. The method of claim 9, wherein the element is selected from the group consisting essentially of carbon and germanium.

11. The method of claim 9, wherein the step of implanting the additional element uses an energy of between about 5 keV and about 10 keV.

* * * * *